United States Patent
Zablotny et al.

[19]

[11] Patent Number: 5,880,011

[45] Date of Patent: Mar. 9, 1999

[54] METHOD AND APPARATUS FOR MANUFACTURING PRE-TERMINATED CHIPS

[75] Inventors: Gordon O. Zablotny, Escondido; James W. Horner, Oceanside; John M. Lower, Jr., San Marcos, all of Calif.

[73] Assignee: Pacific Trinetics Corporation, Carlsbad, Calif.

[21] Appl. No.: 666,192

[22] Filed: Jun. 19, 1996

[51] Int. Cl.[6] .................................................. H01L 21/301
[52] U.S. Cl. ........................................... 438/462; 438/113
[58] Field of Search .................................. 438/460, 461, 438/462, 463, 464, 465, 113, 114

[56] References Cited

U.S. PATENT DOCUMENTS

| | | |
|---|---|---|
| 3,374,533 | 3/1968 | Burks et al. . |
| 3,926,746 | 12/1975 | Hargis . |
| 4,426,773 | 1/1984 | Hargis ...................................... 438/462 |
| 4,930,216 | 6/1990 | Nelson ..................................... 438/462 |
| 4,949,217 | 8/1990 | Ngo . |
| 5,126,286 | 6/1992 | Chance .................................... 430/462 |
| 5,276,963 | 1/1994 | Flanders . |

FOREIGN PATENT DOCUMENTS

| | | |
|---|---|---|
| 0535995 | 4/1993 | European Pat. Off. . |
| 0582881 | 2/1994 | European Pat. Off. . |
| 0637828 | 2/1995 | European Pat. Off. . |
| 0689245 | 12/1995 | European Pat. Off. . |
| 3931996 | 4/1990 | Germany . |

*Primary Examiner*—Kevin M. Picardat
*Attorney, Agent, or Firm*—Brown, Martin, Haller & McClain, LLP

[57] ABSTRACT

A method and apparatus for forming edge terminations in multi-layer electrical component chips, such as capacitor chips, is arranged to cut holes through a laminated printed circuit pad at locations corresponding to the boundaries between adjacent chips when the pad is subsequently cut into individual chips. The holes are then filled with conductive ink to form plugs spanning the boundaries. The pad is then cut along a grid of perpendicular cutting lines defining the individual chip areas, simultaneously cutting through each of the ink plugs so that the cut ink plugs form the appropriate edge terminations along each side edge of a chip. The cutting device is suitably programmed to cut holes over the areas corresponding to the desired edge termination sizes and positions.

9 Claims, 2 Drawing Sheets

METHOD AND APPARATUS FOR MANUFACTURING PRE-TERMINATED CHIPS

BACKGROUND OF THE INVENTION

The present invention relates generally to laminated printed circuit chips such as capacitor chips, and is particularly concerned with a method and apparatus for making such chips incorporating terminations at the side edges of the chips.

Currently, laminated printed circuit chips are made by laminating together several layers of ceramic on which circuit patterns are printed into a stack, and then cutting the stack into individual chips according to the selected chip size. The cutting process will leave cut conductor ends on the side edges of each chip, and the cut ends are terminated by dipping the edges into a plating bath. This procedure is relatively simple for large size chips, but for small chips it is difficult to perform and very expensive. It also results in small bumps projecting from the sides of the chip. The smallest capacitor chips may have an area as small as 0.040 inches by 0.020 inches (which is referred to as an 0402 chip size), and it is extremely difficult to provide multiple terminations on the side edges of a chip this small using the known dipping process.

SUMMARY OF THE INVENTION

It is an object of the present invention to provide a new and improved method and apparatus for forming the terminations at the side edges of multi-layer, electrical component chips.

According to one aspect of the present invention, a method of making side edge terminations in electrical component chips is provided which comprises the steps of taking a formed, multi-layer electrical component pad which is to be cut into a plurality of individual rectangular chips, punching holes through the pad at predetermined spaced positions on the pad, the holes defining a first set of parallel linear paths across the pad and a second set of parallel linear paths extending perpendicular to the first set to form a rectangular grid, injecting ink into the holes to form ink-filled regions, drying the ink, and cutting the pad along each of the linear paths and through the ink-filled regions to form individual chips, with the cut ink-filled regions forming the edge terminations of the respective chips.

Preferably, the pad is marked or pre-printed at least at the outer edges to provide fiducials for later cutting of the pad into individual chips, and the same fiducials may be used for aligning a suitable cutting or punching device for punching spaced holes along each of the predetermined cutting lines. Alternatively, the pad may be marked or printed with non-conductive ink to provide a grid across its upper surface corresponding to the cutting lines, prior to cutting the spaced holes along each line.

This provides a much easier, less expensive and more accurate technique for forming edge terminations in multi-layer electrical component chips, particularly for very small size chips. All that is necessary is to determine the desired edge termination locations, punch the appropriate holes at the cutting lines, fill those holes with ink, and cut the pad along the cutting lines, which simultaneously forms the desired edge terminations. In the past, edge terminations had to be made in a completely separate process after cutting the chips to size, whereas this method allows edge terminations to be formed automatically at the same time as the chips are cut.

Another advantage of this method is that the same material can be used for the contacts and the terminations, since they will be co-fired together. In the previous technique, where terminations were made in a separate dipping bath, the terminations had to be made using a different conductive ink having a lower firing temperature than the contact ink, so that the terminations could be fired separately without causing the contacts to melt. With the method of this invention, since the contacts and terminations are co-fired, the same material can be used for the terminations as the contacts, for example palladium silver, which has a higher firing temperature than that of the materials previously used for such terminations.

Thus, with the method of this invention, after cutting the chips to size, the chips are fired, firing the contacts and edge terminations simultaneously. Another advantage of this method is that there will be no bumps or projections at the side edges of each chip or at the top and bottom faces of the chip along the side edge.

According to another aspect of the present invention, an apparatus for forming edge terminations in integrated circuit chips is provided, which comprises a punching device for punching holes through the pad at predetermined spaced locations along a first set of parallel linear paths across the pad and a second set of parallel linear paths extending perpendicular to the first set to form a rectangular grid, a controller for controlling the punching device to punch the holes at said predetermined positions corresponding to predetermined edge terminations at each chip edge, an ink injector for injecting ink to fill each punched hole, drying means for drying the ink, and a cutting device for cutting the pad along each of the linear paths and through the injected ink portions to cut the pad into individual chips with the cut injected ink portions corresponding to the edge terminations.

This apparatus and method allows for easy, accurate convenient and inexpensive formation of edge terminations in multi-layer electrical component chips, such as capacitor chips, regardless of the chip size. One or more edge terminations can be easily formed along each side edge of each of the chips, according to any desired pattern, simply by suitable programming of the controller which controls operation of the punching device.

BRIEF DESCRIPTION OF THE DRAWINGS

The present invention will be better understood from the following detailed description of a preferred embodiment of the invention, taken in conjunction with the accompanying drawings, in which like reference numerals refer to like parts, and in which.

DESCRIPTION OF THE PREFERRED EMBODIMENT

Figure 1:
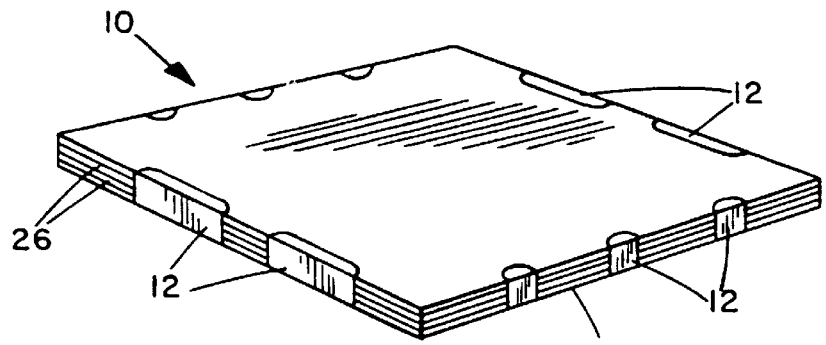
FIG. 1 illustrates a finished chip on an enlarged scale, made according to a preferred embodiment of the method of the present invention.

FIG. 1 of the drawings illustrates a finished individual capacitor chip 10 with integral edge terminations 12 formed using a method and apparatus according to a preferred embodiment of the present invention, as described in more detail below with reference to FIGS. 2–7, which illustrate successive steps in the method and the various parts of the apparatus.

Figure 2:
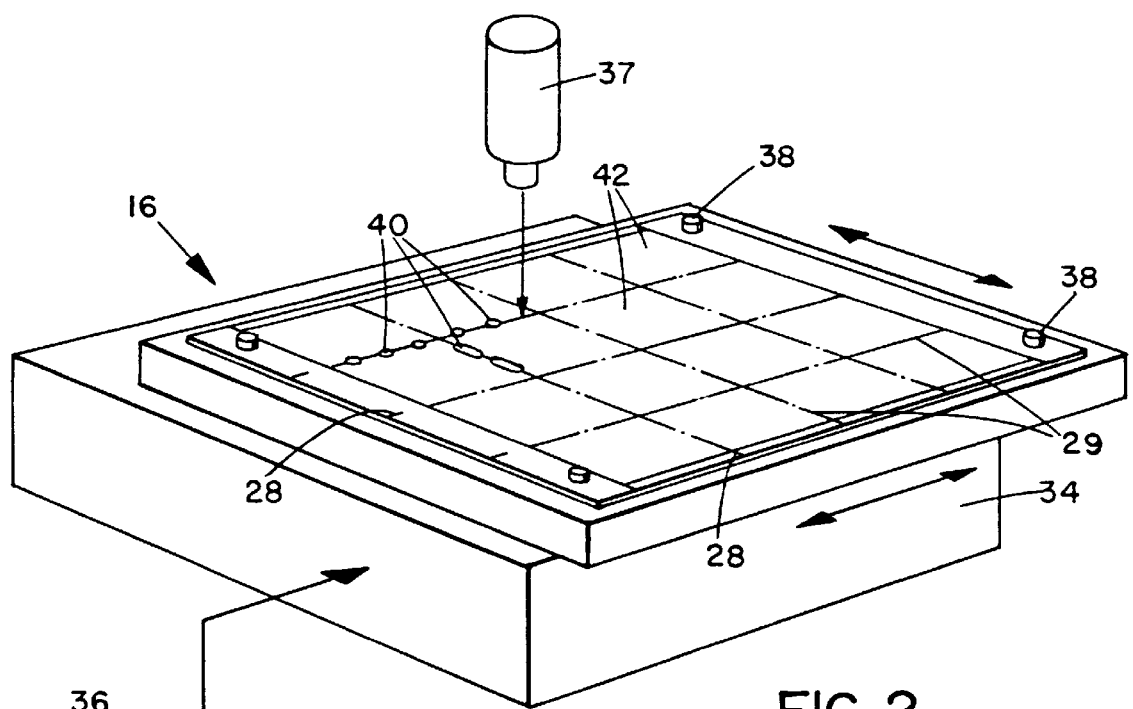
FIG. 2 illustrates the laser perforation of a laminated multiple chip pad according to one step of the method.

FIG. 2 illustrates an integrated circuit pad 24 which is formed by laminating together a stack of ceramic wafers 26 on which circuits and contacts have been printed in a conventional manner. Such pads are typically provided with tick marks or fiducials 28 on perpendicular side edges for suitable positioning of a cutting device for later cutting the pad into individual rectangular chips. The pad is also provided with indexing holes 32 at its corners, in the conventional manner.

The pad 24 is placed onto an indexing platform 34 of the hole cutting station 16. Any suitable cutting machine or device may be used, including laser cutting devices as well as mechanical punches. In a preferred embodiment of the invention, hole cutting station 16 is a laser cutting machine, suitably a Model LVS-3012 Laser Via System as manufactured by Pacific Trinetics Corporation of Carlsbad, Calif.

The laser cutting machine includes a programmable motion controller 36 linked to x-y indexing platform 34, and a laser 37 for cutting holes through a workpiece on the platform. Pad 24 is placed so that indexing pins 38 on the platform extend through the indexing holes 32. The controller is programmed so that the laser punches holes 40 through the pad 24 at spaced intervals along each of a first parallel set of lines 29 and a second set of parallel lines 30 perpendicular to the first set, as indicated by the dotted lines in FIG. 2. The laser may be positioned along each of the lines using the edge fiducials 28. The lines or linear paths along which the holes are formed define a grid pattern corresponding to the boundaries between adjacent, individual chip forming areas 42. The platform 34 is suitably controlled to drive the platen in the x and y directions along successive lines 29 and 30, stopping at each hole position under laser 37 while the laser is turned on to punch a hole. Round or elongated holes may be punched, depending on the program instructions, which will in turn depend on the required edge terminations for the particular chip being made. Preferably, at least one opening is formed along each of the side edge boundaries of each individual square or rectangular chip forming area, and two or more openings may be formed in each side edge boundary if required.

Although existing edge markings or fiducials may be used for lining up the laser along the desired chip-defining lines, in an alternative arrangement the upper face of pad 24 may be pre-marked with grid lines 29 and 30 using a suitable non-conductive ink.

Figure 3:
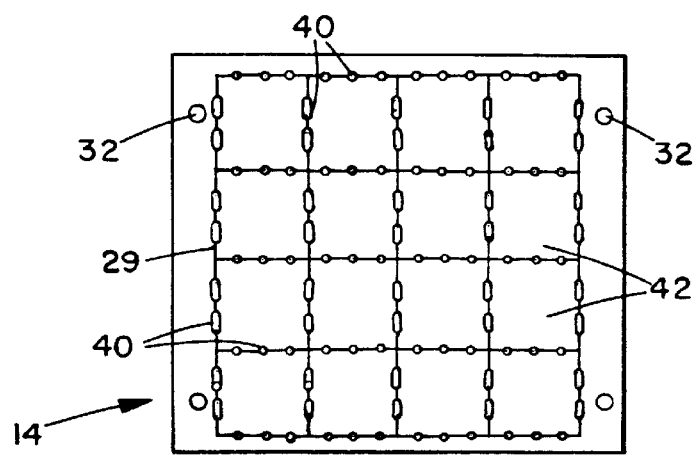
FIG. 3 is a face view of the perforated pad.

FIG. 3 illustrates the perforated pad at the end of a hole punching step with suitable openings 40 formed along each of the grid lines at the perimeter of each chip forming area 42. It can be seen that half of each opening is located along a side edge of one chip forming area 42, while the other half is located along a side edge of an adjacent chip forming area 42.

Figure 4:
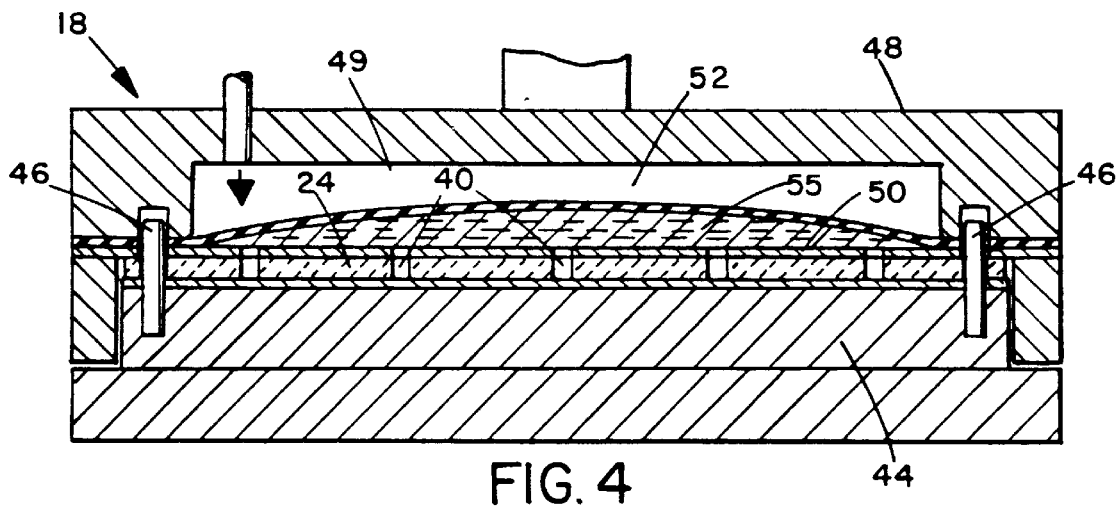
FIG. 4 is a sectional view showing the filling of the perforations with conductive ink or paste.

After all the holes have been formed, the perforated pad is transported to the via filling station 18, illustrated in FIG. 4. Any suitable via filling apparatus may be used, such as the Model VF-1000 via filler manufactured by Pacific Trinetics Corporation of Carlsbad, Calif., which is also described in U.S. Pat. No. 4,519,760. The via filler basically comprises a vacuum stage or platform 44 with indexing or registration pins 46 for extending through the indexing holes 32 in the pad, and an upper injection device 48 which is movable into registration over the platform as illustrated in FIG. 4. The injection device 48 has a downwardly facing chamber 49 over which a mask 50 is secured, with the mask having openings corresponding in size and position to the openings 40 in the pad. A flexible diaphragm 52 is secured behind the mask, and the space 54 between the mask and diaphragm is filled with a high viscosity conductive ink or paste 55. The injection device and platform are held together with the holes in the mask in registration with the holes in the pad, and pressurized fluid is supplied to chamber 49 above the diaphragm 52 so as to force the ink out through the mask openings and into each of the openings 40 in the pad.

Figure 5:
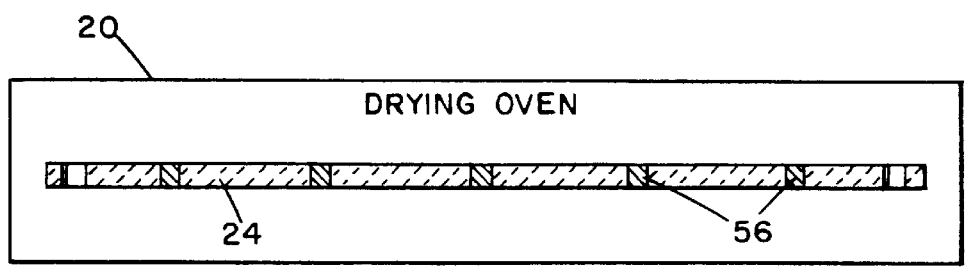
FIG. 5 illustrates the initial drying stage of the paste.
Figure 6:
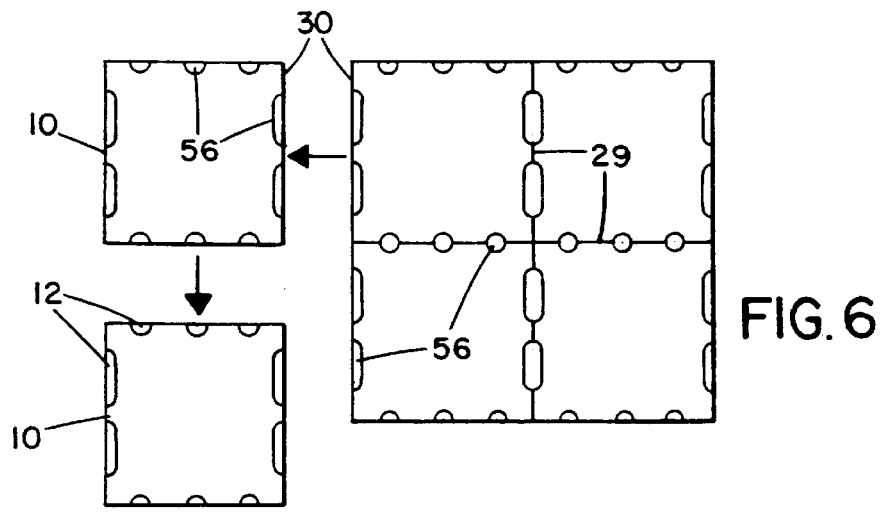
FIG. 6 shows the cutting of individual chips from the wafer.

After each opening 40 has been filled with ink 55 to form ink plugs 56, the pad is removed from via filler 18 and transported to a drying oven 20. As illustrated in FIG. 5, the pad is inserted into the oven 20 and kept there for a sufficient length of time to dry the ink plugs 56. Subsequently, the pad is removed from oven 20 and transported to a chip cutting station, which is schematically illustrated in FIG. 6. At the cutting station, a suitable cutting device such as a hot knife cutter or laser is programmed to cut the pad along each of the grid lines 29 and 30 so as to cut it into individual chips, using the edge fiducials 28 to line up the cutting device along each of the lines. Simultaneously, the cutting device will also cut each of the openings 40, and the dried ink plug 56 in each opening, in half, with one half on one chip edge and the other half on another, adjacent chip edge. The cut ink plug portions form contact terminations 12 along the side edges of each chip, so that the leads or contacts in each layer which would otherwise form exposed cut ends in the chip side edges are instead connected together via terminations 12.

Figure 7:
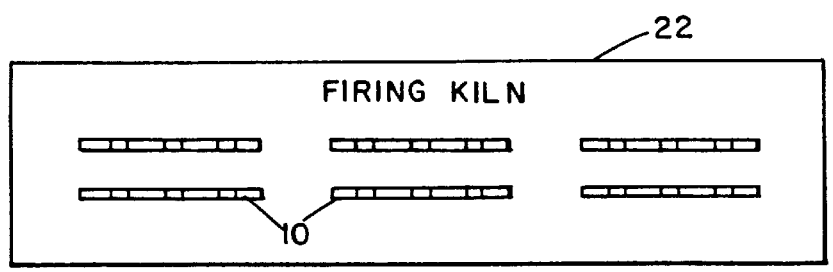
FIG. 7 shows the final firing of the chips.

The cut chips 10 are then transported to a conventional firing kiln 22, illustrated schematically in FIG. 7, and fired at a firing temperature dependent on the ink used for the electrodes on each wafer in the pad and also the ink used for the edge terminations. Because these are co-fired, the inks used may be the same and there is no need for the edge terminations to be made using an ink with a lower firing temperature than the electrode ink.

FIG. 1 illustrates one of the finished chips in more detail. The method of this invention provides accurate edge terminations 12 which do not project or bulge outwardly from the sides, top or bottom faces of the chip, but instead have faces which are flush with the adjacent chip faces, as can be seen in FIG. 1. In contrast, chips with edge terminations formed by dipping the edges in a conductive ink will have bulges along the side edges where the ink projects out from the side edges. Another advantage of this method and apparatus is that the edge terminations can be much more accurately formed, even with very small individual chip sizes, and the method is much faster and less expensive than the previous bath dipping technique.

Although a preferred embodiment of the invention has been described above by way of example only, it will be understood by those skilled in the field that modifications may be made to the disclosed embodiment without departing from the scope of the invention, which is defined by the appended claims.

We claim:

1. A method of forming multi-layer electrical component chips with built-in edge terminations, comprising the steps of:

taking a laminated pad of individual printed circuit wafers for cutting into individual rectangular chips;

cutting holes through the pad at predetermined spaced positions on the pad, the holes defining a first set of parallel linear paths across the pad and a second set of parallel linear paths extending perpendicular to the second set to form a rectangular grid;

filling each of the cut holes with conductive ink to form a conductive ink plug;

drying the ink plugs; and cutting the pad through each of the perpendicular sets of linear paths defined by the ink plugs to form a plurality of individual chips, with each ink plug being cut in half to form a first edge termination along one side edge of one chip and a second edge termination along an adjacent side edge of another chip.

2. The method as claimed in claim 1, wherein the step of cutting holes along the first and second sets of parallel linear paths includes lining up a cutting device on each of the linear paths using fiducial markings at the edges of the pad.

3. The method as claimed in claim 1, including the step of marking an upper surface of the pad with a grid of intersecting lines corresponding to said first and second sets of linear paths dividing the pad into individual rectangular chip areas, prior to cutting holes through the pad at predetermined positions along each of the lines.

4. The method as claimed in claim 1, wherein the pad has electrodes of conductive ink and the conductive ink filling the cut holes is the same ink as the pad electrode ink.

5. The method as claimed in claim 4, including the step of placing the cut chips into a firing kiln and firing the chips so as to fire the electrode ink and the edge termination ink simultaneously.

6. The method as claimed in claim 1, wherein at least one hole is cut along each edge of each of the rectangular chip areas.

7. The method as claimed in claim 1, wherein the holes include circular holes and elongated holes.

8. The method as claimed in claim 1, wherein the holes are laser cut.

9. An apparatus for forming edge terminations in multi-layer electrical component chips, comprising:

a punching device for punching holes through the pad at predetermined spaced locations along a first set of parallel linear paths across the pad and a second set of parallel linear paths extending perpendicular to the first set to form a rectangular grid;

a controller for controlling the punching device to punch the holes at said predetermined positions corresponding to predetermined edge terminations at each chip edge;

a hole filling device for filling the cut holes with conductive ink to form a conductive ink plug;

a drying oven for drying the conductive ink plugs;

a cutting device for cutting the pad along each of the intersecting linear paths and through each ink plug along each of the lines to form a plurality of individual chips, with each ink plug being cut in half to form a first edge termination along one side edge of one chip and a second edge termination along an adjacent side edge of another chip.

* * * * *